(12) United States Patent
Beaman et al.

(10) Patent No.: US 7,344,755 B2
(45) Date of Patent: Mar. 18, 2008

(54) METHODS AND APPARATUS FOR PROCESSING MICROFEATURE WORKPIECES; METHODS FOR CONDITIONING ALD REACTION CHAMBERS

(75) Inventors: Kevin L. Beaman, Boise, ID (US); Ronald A. Weimer, Bosie, ID (US); Lyle D. Breiner, Meridian, ID (US); Er-Xuan Ping, Meridian, ID (US); Trung T. Doan, Bosie, ID (US); Cem Basceri, Bosie, ID (US); David J. Kubista, Nampa, ID (US); Lingyi A. Zheng, Bosie, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/646,673

(22) Filed: Aug. 21, 2003

(65) Prior Publication Data

US 2005/0039680 A1    Feb. 24, 2005

(51) Int. Cl.
*C23C 16/00*    (2006.01)
(52) U.S. Cl. .................. 427/255.7; 427/248.1; 427/255.394; 427/255.391
(58) Field of Classification Search .............. 427/237, 427/248.1, 255.7, 255.394, 255.391
See application file for complete search history.

(56) References Cited

U.S. PATENT DOCUMENTS

| | | | |
|---|---|---|---|
| 3,618,919 A | 11/1971 | Beck | |
| 3,620,934 A | 11/1971 | Endle | |
| 3,630,769 A | 12/1971 | Hart et al. | |
| 3,630,881 A | 12/1971 | Lester et al. | |
| 3,634,212 A | 1/1972 | Valayll et al. | |
| 4,018,949 A | 4/1977 | Donakowski et al. | |
| 4,242,182 A | 12/1980 | Popescu | |
| 4,269,625 A | 5/1981 | Molenaar | |
| 4,289,061 A | 9/1981 | Emmett | |
| 4,313,783 A | 2/1982 | Davies et al. | |
| 4,388,342 A | 6/1983 | Suzuki et al. | |
| 4,397,753 A | 8/1983 | Czaja | |

(Continued)

FOREIGN PATENT DOCUMENTS

DE    198 51 824 A1    5/2000

(Continued)

OTHER PUBLICATIONS

U.S. Appl. No. 09/651,037, filed Aug. 30, 2000, Mardian.

(Continued)

*Primary Examiner*—Timothy Meeks
*Assistant Examiner*—David Turocy
(74) *Attorney, Agent, or Firm*—Perkins Coie LLP

(57) ABSTRACT

The present disclosure provides methods and apparatus that may be used to process microfeature workpieces, e.g., semiconductor wafers. Some aspects have particular utility in depositing TiN in a batch process. One implementation involves pretreating a surface of a process chamber by contemporaneously introducing first and second pretreatment precursors (e.g., $TiCl_4$ and $NH_3$) to deposit a pretreatment material on a the chamber surface. After the pretreatment, the first microfeature workpiece may be placed in the chamber and TiN may be deposited on the microfeature workpiece by alternately introducing quantities of first and second deposition precursors.

12 Claims, 6 Drawing Sheets

U.S. PATENT DOCUMENTS

| | | |
|---|---|---|
| 4,436,674 A | 3/1984 | McMenamin |
| 4,438,724 A | 3/1984 | Doehler et al. |
| 4,469,801 A | 9/1984 | Hirai et al. |
| 6,503,330 B1 | 3/1985 | Hearn |
| 6,506,254 B1 | 3/1985 | Right et al. |
| 4,509,456 A | 4/1985 | Kleinert et al. |
| 4,545,136 A | 10/1985 | Izu et al. |
| 4,590,042 A | 5/1986 | Drage |
| 4,593,644 A | 6/1986 | Hanak |
| 4,681,777 A | 7/1987 | Engelken et al. |
| 4,826,579 A | 5/1989 | Westfall |
| 4,894,132 A | 1/1990 | Tanaka et al. |
| 4,911,638 A | 3/1990 | Bayne et al. |
| 4,923,715 A | 5/1990 | Matsuda et al. |
| 4,948,979 A | 8/1990 | Munakata et al. |
| 4,949,669 A | 8/1990 | Ishii et al. |
| 4,966,646 A | 10/1990 | Zdeblick |
| 4,977,106 A | 12/1990 | Smith |
| 5,015,330 A | 5/1991 | Okumura et al. |
| 5,017,404 A | 5/1991 | Paquet et al. |
| 5,020,476 A | 6/1991 | Bay et al. |
| 5,062,446 A | 11/1991 | Anderson |
| 5,076,205 A | 12/1991 | Vowles et al. |
| 5,090,985 A | 2/1992 | Soubeyrand |
| 5,091,207 A | 2/1992 | Tanaka |
| 5,131,752 A | 7/1992 | Yu et al. |
| 5,136,975 A | 8/1992 | Bartholomew et al. |
| 5,172,849 A | 12/1992 | Barten et al. |
| 5,200,023 A | 4/1993 | Gifford et al. |
| 5,223,113 A | 6/1993 | Kaneko et al. |
| 5,232,749 A | 8/1993 | Gilton |
| 5,248,527 A | 9/1993 | Uchida et al. |
| 5,286,296 A | 2/1994 | Sato et al. |
| 5,325,020 A | 6/1994 | Campbell, deceased et al. |
| 5,364,219 A | 11/1994 | Takahashi et al. |
| 5,366,557 A | 11/1994 | Yu |
| 5,377,429 A | 1/1995 | Sandhu et al. |
| 5,380,396 A | 1/1995 | Shikida et al. |
| 5,409,129 A | 4/1995 | Tsukada et al. |
| 5,418,180 A | 5/1995 | Brown |
| 5,427,666 A | 6/1995 | Mueller et al. |
| 5,433,787 A | 7/1995 | Suzuki et al. |
| 5,433,835 A | 7/1995 | Demaray et al. |
| 5,445,491 A | 8/1995 | Nakagawa et al. |
| 5,453,124 A | 9/1995 | Moslehi et al. |
| 5,480,818 A | 1/1996 | Matsumoto et al. |
| 5,496,410 A | 3/1996 | Fukuda et al. |
| 5,498,292 A | 3/1996 | Ozaki |
| 5,500,256 A | 3/1996 | Watabe |
| 5,522,934 A | 6/1996 | Suzuki et al. |
| 5,536,317 A | 7/1996 | Crain et al. |
| 5,562,800 A | 10/1996 | Kawamura et al. |
| 5,575,883 A | 11/1996 | Nishikawa et al. |
| 5,589,002 A | 12/1996 | Su |
| 5,589,110 A | 12/1996 | Motoda et al. |
| 5,592,581 A | 1/1997 | Okase |
| 5,595,606 A | 1/1997 | Fujikawa et al. |
| 5,599,513 A | 2/1997 | Masaki et al. |
| 5,624,498 A | 4/1997 | Lee et al. |
| 5,626,936 A | 5/1997 | Alderman |
| 5,640,751 A | 6/1997 | Faria |
| 5,643,394 A | 7/1997 | Maydan et al. |
| 5,654,589 A | 8/1997 | Huang et al. |
| 5,693,288 A | 12/1997 | Nakamura |
| 5,716,796 A | 2/1998 | Bull et al. |
| 5,729,896 A | 3/1998 | Dalal et al. |
| 5,746,434 A | 5/1998 | Boyd et al. |
| 5,754,297 A | 5/1998 | Nulman |
| 5,766,364 A | 6/1998 | Ishida et al. |
| 5,769,950 A | 6/1998 | Takasu et al. |
| 5,769,952 A | 6/1998 | Komino |
| 5,788,778 A | 8/1998 | Shang et al. |
| 5,792,269 A | 8/1998 | Deacon et al. |
| 5,792,700 A | 8/1998 | Turner et al. |
| 5,819,683 A | 10/1998 | Ikeda et al. |
| 5,820,641 A | 10/1998 | Gu et al. |
| 5,827,370 A | 10/1998 | Gu |
| 5,833,888 A | 11/1998 | Arya et al. |
| 5,846,275 A | 12/1998 | Lane et al. |
| 5,846,330 A | 12/1998 | Quirk et al. |
| 5,851,294 A | 12/1998 | Young et al. |
| 5,851,849 A | 12/1998 | Comizzoli et al. |
| 5,865,417 A | 2/1999 | Harris et al. |
| 5,866,986 A | 2/1999 | Pennington |
| 5,868,159 A | 2/1999 | Loan et al. |
| 5,879,459 A | 3/1999 | Gadgil et al. |
| 5,885,425 A | 3/1999 | Hsieh et al. |
| 5,895,530 A | 4/1999 | Shrotriya et al. |
| 5,902,403 A | 5/1999 | Aitani et al. |
| 5,908,947 A | 6/1999 | Vaartstra |
| 5,911,238 A | 6/1999 | Bump et al. |
| 5,932,286 A | 8/1999 | Beinglass et al. |
| 5,953,634 A | 9/1999 | Kajita et al. |
| 5,956,613 A | 9/1999 | Zhao et al. |
| 5,958,140 A | 9/1999 | Arami et al. |
| 5,961,775 A | 10/1999 | Fujimura et al. |
| 5,968,587 A | 10/1999 | Frankel |
| 5,972,430 A | 10/1999 | DiMeo, Jr. et al. |
| 5,994,181 A | 11/1999 | Hsieh et al. |
| 5,997,588 A | 12/1999 | Goodwin et al. |
| 5,998,932 A | 12/1999 | Lenz |
| 6,006,694 A | 12/1999 | DeOrnellas et al. |
| 6,008,086 A | 12/1999 | Schuegraf et al. |
| 6,022,483 A | 2/2000 | Aral |
| 6,032,923 A | 3/2000 | Biegelsen et al. |
| 6,039,557 A | 3/2000 | Unger et al. |
| 6,042,652 A | 3/2000 | Hyun et al. |
| 6,045,620 A | 4/2000 | Tepman et al. |
| 6,059,885 A | 5/2000 | Ohashi et al. |
| 6,062,256 A | 5/2000 | Miller et al. |
| 6,070,551 A | 6/2000 | Li et al. |
| 6,079,426 A | 6/2000 | Subrahmanyam et al. |
| 6,080,446 A | 6/2000 | Tobe et al. |
| 6,086,677 A | 7/2000 | Umotoy et al. |
| 6,089,543 A | 7/2000 | Freerks |
| 6,090,210 A | 7/2000 | Ballance et al. |
| 6,109,206 A | 8/2000 | Maydan et al. |
| 6,113,698 A | 9/2000 | Raaijmakers et al. |
| 6,123,107 A | 9/2000 | Selser et al. |
| 6,129,331 A | 10/2000 | Henning et al. |
| 6,139,700 A | 10/2000 | Kang et al. |
| 6,142,163 A | 11/2000 | McMillin et al. |
| 6,143,077 A | 11/2000 | Ikeda et al. |
| 6,143,078 A | 11/2000 | Ishikawa et al. |
| 6,143,659 A | 11/2000 | Leem |
| 6,144,060 A | 11/2000 | Park et al. |
| 6,149,123 A | 11/2000 | Harris et al. |
| 6,159,297 A | 12/2000 | Herchen et al. |
| 6,159,298 A | 12/2000 | Saito |
| 6,160,243 A | 12/2000 | Cozad |
| 6,161,500 A | 12/2000 | Kopacz et al. |
| 6,173,673 B1 | 1/2001 | Golovato et al. |
| 6,174,366 B1 | 1/2001 | Ihantola |
| 6,174,377 B1 | 1/2001 | Doering et al. |
| 6,174,809 B1 | 1/2001 | Kang et al. |
| 6,178,660 B1 | 1/2001 | Emmi et al. |
| 6,182,603 B1 | 2/2001 | Shang et al. |
| 6,183,563 B1 | 2/2001 | Choi et al. |
| 6,190,459 B1 | 2/2001 | Takeshita et al. |
| 6,192,827 B1 | 2/2001 | Welch et al. |
| 6,193,802 B1 | 2/2001 | Pang et al. |
| 6,194,628 B1 | 2/2001 | Pang et al. |
| 6,197,119 B1 | 3/2001 | Dozoretz et al. |
| 6,200,415 B1 | 3/2001 | Maraschin |

| Patent | Date | Inventor |
|---|---|---|
| 6,203,613 B1 | 3/2001 | Gates et al. |
| 6,206,967 B1 | 3/2001 | Mak et al. |
| 6,206,972 B1 | 3/2001 | Dunham |
| 6,207,937 B1 | 3/2001 | Stoddard et al. |
| 6,210,754 B1 | 4/2001 | Lu et al. |
| 6,211,033 B1 | 4/2001 | Sandhu et al. |
| 6,211,078 B1 | 4/2001 | Matthews |
| 6,214,714 B1 | 4/2001 | Wang et al. |
| 6,237,394 B1 | 5/2001 | Harris et al. |
| 6,237,529 B1 | 5/2001 | Spahn |
| 6,245,192 B1 | 6/2001 | Dhindsa et al. |
| 6,251,190 B1 | 6/2001 | Mak et al. |
| 6,255,222 B1 | 7/2001 | Xia et al. |
| 6,263,829 B1 | 7/2001 | Schneider et al. |
| 6,264,788 B1 | 7/2001 | Tomoyasu et al. |
| 6,270,572 B1 | 8/2001 | Kim et al. |
| 6,273,954 B2 | 8/2001 | Nishikawa et al. |
| 6,277,763 B1 | 8/2001 | Kugimiya et al. |
| 6,280,584 B1 | 8/2001 | Kumar et al. |
| 6,287,965 B1 | 9/2001 | Kang et al. |
| 6,287,980 B1 | 9/2001 | Hanazaki et al. |
| 6,290,491 B1 | 9/2001 | Shahvandi et al. |
| 6,291,337 B1 | 9/2001 | Sidhwa |
| 6,294,394 B1 | 9/2001 | Erickson et al. |
| 6,297,539 B1 | 10/2001 | Ma et al. |
| 6,302,964 B1 | 10/2001 | Umotoy et al. |
| 6,302,965 B1 | 10/2001 | Umotoy et al. |
| 6,303,953 B1 | 10/2001 | Doan et al. |
| 6,305,314 B1 | 10/2001 | Sneh et al. |
| 6,309,161 B1 | 10/2001 | Hofmeister |
| 6,315,859 B1 | 11/2001 | Donohoe |
| 6,328,803 B2 | 12/2001 | Rolfson et al. |
| 6,329,297 B1 | 12/2001 | Balish et al. |
| 6,333,272 B1 | 12/2001 | McMillin et al. |
| 6,334,928 B1 | 1/2002 | Sekine et al. |
| 6,342,277 B1 | 1/2002 | Sherman |
| 6,346,477 B1 | 2/2002 | Kaloyeros et al. |
| 6,347,602 B2 | 2/2002 | Goto et al. |
| 6,347,918 B1 | 2/2002 | Blahnik |
| 6,355,561 B1 | 3/2002 | Sandhu et al. |
| 6,358,323 B1 | 3/2002 | Schmitt et al. |
| 6,364,219 B1 | 4/2002 | Zimmerman et al. |
| 6,374,831 B1 | 4/2002 | Chandran et al. |
| 6,383,300 B1 | 5/2002 | Saito et al. |
| 6,387,185 B2 | 5/2002 | Doering et al. |
| 6,387,207 B1 | 5/2002 | Janakiraman et al. |
| 6,402,806 B1 | 6/2002 | Schmitt et al. |
| 6,402,849 B2 | 6/2002 | Kwag et al. |
| 6,415,736 B1 | 7/2002 | Hao et al. |
| 6,419,462 B1 | 7/2002 | Horie et al. |
| 6,420,230 B1 | 7/2002 | Derderian et al. |
| 6,420,742 B1 | 7/2002 | Ahn et al. |
| 6,425,168 B1 | 7/2002 | Takaku |
| 6,428,859 B1 | 8/2002 | Chiang et al. |
| 6,432,256 B1 | 8/2002 | Raoux |
| 6,432,259 B1 | 8/2002 | Noorbaksh et al. |
| 6,432,831 B2 | 8/2002 | Dhindsa et al. |
| 6,435,865 B1 | 8/2002 | Tseng et al. |
| 6,444,039 B1 | 9/2002 | Nguyen |
| 6,450,117 B1 | 9/2002 | Murugesh et al. |
| 6,451,119 B2 | 9/2002 | Sneh et al. |
| 6,458,416 B1 | 10/2002 | Derderian et al. |
| 6,461,436 B1 | 10/2002 | Campbell et al. |
| 6,461,931 B1 | 10/2002 | Eldridge |
| 6,508,268 B1 | 1/2003 | Kouketsu et al. |
| 6,509,280 B2 | 1/2003 | Choi |
| 6,534,007 B1 | 3/2003 | Blonigan et al. |
| 6,534,395 B2 | 3/2003 | Werkhoven et al. |
| 6,540,838 B2 | 4/2003 | Sneh et al. |
| 6,541,353 B1 | 4/2003 | Sandhu et al. |
| 6,551,929 B1 | 4/2003 | Kori et al. |
| 6,562,140 B1 | 5/2003 | Bondestam et al. |
| 6,562,141 B2 | 5/2003 | Clarke |
| 6,573,184 B2 | 6/2003 | Park |
| 6,579,372 B2 | 6/2003 | Park |
| 6,579,374 B2 | 6/2003 | Bondestam et al. |
| 6,585,823 B1 | 7/2003 | Van Wijck |
| 6,596,085 B1 | 7/2003 | Schmitt et al. |
| 6,602,346 B1 | 8/2003 | Gochberg et al. |
| 6,622,104 B2 | 9/2003 | Wang et al. |
| 6,630,201 B2 | 10/2003 | Chiang et al. |
| 6,635,965 B1 | 10/2003 | Lee et al. |
| 6,638,672 B2 | 10/2003 | Deguchi |
| 6,638,879 B2 | 10/2003 | Hsieh et al. |
| 6,641,673 B2 | 11/2003 | Yang |
| 6,663,713 B1 | 12/2003 | Robles et al. |
| 6,666,982 B2 | 12/2003 | Brcka |
| 6,673,196 B1 | 1/2004 | Oyabu |
| 6,689,220 B1 | 2/2004 | Nguyen |
| 6,704,913 B2 | 3/2004 | Rossman |
| 6,705,345 B1 | 3/2004 | Bifano |
| 6,706,334 B1 | 3/2004 | Kobayashi et al. |
| 6,734,020 B2 | 5/2004 | Lu et al. |
| 6,770,145 B2 | 8/2004 | Saito |
| 6,800,139 B1 | 10/2004 | Shinriki et al. |
| 6,807,971 B2 | 10/2004 | Saito et al. |
| 6,814,813 B2 | 11/2004 | Dando et al. |
| 6,818,249 B2 | 11/2004 | Derderian |
| 6,821,347 B2 | 11/2004 | Carpenter et al. |
| 6,830,652 B1 | 12/2004 | Ohmi et al. |
| 6,838,114 B2 | 1/2005 | Carpenter et al. |
| 6,845,734 B2 | 1/2005 | Carpenter et al. |
| 6,849,131 B2 | 2/2005 | Chen et al. |
| 6,861,094 B2 | 3/2005 | Derderian et al. |
| 6,861,356 B2 | 3/2005 | Matsuse et al. |
| 6,881,295 B2 | 4/2005 | Nagakura |
| 6,887,521 B2 | 5/2005 | Basceri |
| 6,905,547 B1 | 6/2005 | Londergan et al. |
| 6,905,549 B2 | 6/2005 | Okuda et al. |
| 6,955,725 B2 | 10/2005 | Dando |
| 6,966,936 B2 | 11/2005 | Yamasaki et al. |
| 6,991,684 B2 | 1/2006 | Kannan et al. |
| 7,022,184 B2 | 4/2006 | Van Wijck et al. |
| 7,086,410 B2 | 8/2006 | Chouno et al. |
| 2001/0001952 A1 | 5/2001 | Nishizawa et al. |
| 2001/0010309 A1 | 8/2001 | Van Blisen |
| 2001/0011526 A1 | 8/2001 | Doering et al. |
| 2001/0012697 A1 | 8/2001 | Mikata |
| 2001/0024387 A1 | 9/2001 | Raaijmakers et al. |
| 2001/0029892 A1 | 10/2001 | Cook et al. |
| 2001/0045187 A1 | 11/2001 | Uhlenbrock |
| 2001/0050267 A1 | 12/2001 | Hwang et al. |
| 2001/0054484 A1 | 12/2001 | Komino |
| 2002/0000202 A1 | 1/2002 | Yuda et al. |
| 2002/0007790 A1* | 1/2002 | Park .................. 118/715 |
| 2002/0020353 A1 | 2/2002 | Redemann et al. |
| 2002/0042205 A1 | 4/2002 | McMillin et al. |
| 2002/0043216 A1 | 4/2002 | Hwang et al. |
| 2002/0052097 A1 | 5/2002 | Park |
| 2002/0073924 A1 | 6/2002 | Chiang et al. |
| 2002/0076490 A1 | 6/2002 | Chiang et al. |
| 2002/0076507 A1 | 6/2002 | Chiang et al. |
| 2002/0076508 A1 | 6/2002 | Chiang et al. |
| 2002/0094689 A1 | 7/2002 | Park |
| 2002/0100418 A1 | 8/2002 | Sandhu et al. |
| 2002/0104481 A1 | 8/2002 | Chiang et al. |
| 2002/0108714 A1 | 8/2002 | Doering et al. |
| 2002/0110991 A1 | 8/2002 | Li |
| 2002/0127745 A1 | 9/2002 | Lu et al. |
| 2002/0129768 A1 | 9/2002 | Carpenter et al. |
| 2002/0132374 A1 | 9/2002 | Basceri et al. |
| 2002/0144655 A1 | 10/2002 | Chiang et al. |
| 2002/0146512 A1 | 10/2002 | Rossman |
| 2002/0162506 A1 | 11/2002 | Sneh et al. |
| 2002/0164420 A1 | 11/2002 | Derderian et al. |
| 2002/0185067 A1 | 12/2002 | Upham |

| | | | | | | |
|---|---|---|---|---|---|---|
| 2002/0195056 | A1 | 12/2002 | Sandhu et al. | JP | 63-111177 A | 5/1988 |
| 2002/0195145 | A1 | 12/2002 | Lowery et al. | JP | 63234198 A | 9/1988 |
| 2002/0195201 | A1 | 12/2002 | Beer | JP | 63-256460 A | 10/1988 |
| 2002/0197402 | A1 | 12/2002 | Chiang et al. | JP | 64-81311 A | 3/1989 |
| 2003/0000473 | A1 | 1/2003 | Chae et al. | JP | 1-273991 A | 11/1989 |
| 2003/0003697 | A1 | 1/2003 | Agarwal et al. | JP | 4-100533 A | 4/1992 |
| 2003/0003730 | A1 | 1/2003 | Li | JP | 4-213818 A | 8/1992 |
| 2003/0013320 | A1 | 1/2003 | Kim et al. | JP | 6054443 A | 2/1994 |
| 2003/0023338 | A1 | 1/2003 | Chin et al. | JP | 6-151558 A | 5/1994 |
| 2004/0003777 | A1 | 1/2003 | Carpenter et al. | JP | 06-201539 | 7/1994 |
| 2003/0024477 | A1 | 2/2003 | Ng et al. | JP | 6-342785 A | 12/1994 |
| 2003/0027428 | A1 | 2/2003 | Sneh et al. | JP | 9-82650 A | 3/1997 |
| 2003/0031794 | A1 | 2/2003 | Tada et al. | JP | 63-20490 A | 1/1998 |
| 2003/0037729 | A1 | 2/2003 | Lee et al. | JP | 10-223719 A | 8/1998 |
| 2003/0037730 | A1 | 2/2003 | Yamasaki et al. | JP | 11-172438 A | 6/1999 |
| 2003/0027431 | A1 | 3/2003 | DeDontney et al. | JP | 2001-82682 A | 3/2001 |
| 2003/0049372 | A1 | 3/2003 | Cook et al. | JP | 2001-261375 A | 9/2001 |
| 2003/0060030 | A1 | 4/2003 | Lee et al. | JP | 2002-164336 A | 6/2002 |
| 2003/0066483 | A1 | 4/2003 | Campbell | JP | 2001-254181 A | 9/2002 |
| 2003/0070617 | A1 | 4/2003 | Kim et al. | KR | 2005112371 A | 11/2005 |
| 2003/0070618 | A1 | 4/2003 | Campbell et al. | SU | 598630 | 3/1978 |
| 2003/0075273 | A1 | 4/2003 | Kilpela et al. | WO | WO-98/37258 A1 | 8/1998 |
| 2003/0079686 | A1 | 5/2003 | Chen et al. | WO | WO-99/06610 A1 | 2/1999 |
| 2003/0094903 | A1 | 5/2003 | Tao et al. | WO | WO-00/40772 A1 | 7/2000 |
| 2003/0098372 | A1 | 5/2003 | Kim | WO | WO-00/63952 A1 | 10/2000 |
| 2003/0098419 | A1 | 5/2003 | Ji et al. | WO | WO-00/65649 A1 | 11/2000 |
| 2003/0106490 | A1 | 6/2003 | Jallepally et al. | WO | WO-00/79019 A1 | 12/2000 |
| 2003/0121608 | A1 | 7/2003 | Chen et al. | WO | WO-01/32966 A1 | 5/2001 |
| 2003/0192645 | A1 | 10/2003 | Liu | WO | WO-01/46490 A1 | 6/2001 |
| 2003/0194862 | A1 | 10/2003 | Mardian et al. | WO | 1 167 569 A1 | 1/2002 |
| 2003/0200926 | A1 | 10/2003 | Dando et al. | WO | WO-02/45871 A1 | 6/2002 |
| 2003/0203109 | A1 | 10/2003 | Dando et al. | WO | WO-02/48427 A1 | 6/2002 |
| 2003/0213435 | A1 | 11/2003 | Okuda et al. | WO | WO-02/073329 A2 | 9/2002 |
| 2004/0000270 | A1 | 1/2004 | Carpenter et al. | WO | WO-02/073660 A2 | 9/2002 |
| 2004/0007188 | A1 | 1/2004 | Burkhart et al. | WO | WO-02/081771 A2 | 10/2002 |
| 2004/0025786 | A1 | 2/2004 | Kontani et al. | WO | WO-02/095807 A2 | 11/2002 |
| 2004/0035358 | A1 | 2/2004 | Basceri et al. | WO | WO-03/008662 A2 | 1/2003 |
| 2004/0040502 | A1 | 3/2004 | Basceri et al. | WO | WO-03/016587 A1 | 2/2003 |
| 2004/0040503 | A1 | 3/2004 | Basceri et al. | WO | WO-03/028069 A2 | 4/2003 |
| 2004/0083959 | A1 | 5/2004 | Carpenter et al. | WO | WO-03/033762 A1 | 4/2003 |
| 2004/0083960 | A1 | 5/2004 | Dando | WO | WO-03/035927 A2 | 5/2003 |
| 2004/0083961 | A1 | 5/2004 | Basceri | WO | WO-03/052807 A1 | 6/2003 |
| 2004/0089240 | A1 | 5/2004 | Dando et al. | | | |
| 2004/0099377 | A1 | 5/2004 | Newton et al. | | | |

OTHER PUBLICATIONS

U.S. Appl. No. 10/365,085, filed Feb. 11, 2003, Carpenter et al.
U.S. Appl. No. 10/665,099, filed Sep. 17, 2003, Basceri et al.
U.S. Appl. No. 10/665,908, filed Sep. 18, 2003, Sarigiannis et al.
U.S. Appl. No. 10/683,424, filed Oct. 10, 2003, Mardian.
U.S. Appl. No. 10/683,606, filed Oct. 9, 2003, Derderian.
U.S. Appl. No. 10/687,458, filed Oct. 15, 2003, Kubista.
U.S. Appl. No. 10/733,523, filed Dec. 10, 2003, Beaman et al.
U.S. Appl. No. 10/767,298, filed Jan. 28, 2004, Zheng et al.
U.S. Appl. No. 10/814,573, filed Mar. 31, 2004, Gealy et al.
U.S. Appl. No. 10/839,316, filed May 5, 2004, Saragianniss et al.
U.S. Appl. No. 10/840,571, filed May 6, 2004, Dando et al.
U.S. Appl. No. 10/859,883, filed Jun. 2, 2004, Miller et al.
U.S. Appl. No. 10/933,604, filed Sep. 2, 2004, Carpenter et al.
U.S. Appl. No. 11/018,142, filed Dec. 20, 2004, Rueger et al.
U.S. Appl. No. 11/027,809, filed Dec. 29, 2004, Carpenter et al.
U.S. Appl. No. 11/027,825, filed Dec. 29, 2004, Derderian et al..
U.S. Appl. No. 11/043,629, file Jan. 25, 2005, Rueger et al.
Integrated Process Systems Ltd., "ALD & CVD", 2 pages, retrieved from the internet on Dec. 11, 2001, <http://www.ips-tech.com/eng/pro-p2-2.htm>.
Deublin Company, "Rotating Unions", 1 page, retrieved from the Internet on Feb. 4, 2002, <http://www.com/products/rotatingunions.htm>.
Cameron, I., "Atomic Layer Deposition Chamber Works at Low Temperatures", 2 pages, ELectronic Times, Jul. 19, 2001, <http://www.electronictimes.com/story/OEG20010719S0042>.
Cutting Edge Optronics, 600W QCW Laser Diode Array, Part Number: ARR48P600, 2 pages, Oct. 2001, <www.ceolase.com>.

| | | | |
|---|---|---|---|
| 2004/0124131 | A1 | 7/2004 | Aitchison et al. |
| 2003/0159780 | A1 | 8/2004 | Carpenter et al. |
| 2004/0154538 | A1 | 8/2004 | Carpenter et al. |
| 2004/0226507 | A1 | 11/2004 | Carpenter et al. |
| 2004/0226516 | A1 | 11/2004 | Daniel et al. |
| 2004/0238123 | A1 | 12/2004 | Becknell et al. |
| 2005/0016956 | A1 | 1/2005 | Liu et al. |
| 2005/0016984 | A1 | 1/2005 | Dando |
| 2005/0022739 | A1 | 2/2005 | Carpenter et al. |
| 2005/0028734 | A1 | 2/2005 | Carpenter et al. |
| 2005/0039680 | A1 | 2/2005 | Beaman et al. |
| 2005/0039686 | A1 | 2/2005 | Zheng et al. |
| 2005/0045100 | A1 | 3/2005 | Derderian |
| 2005/0045102 | A1 | 3/2005 | Zheng et al. |
| 2005/0048742 | A1 | 3/2005 | Dip et al. |
| 2005/0087132 | A1 | 4/2005 | Dickey et al. |
| 2005/0217582 | A1 | 10/2005 | Kim et al. |
| 2006/0115957 | A1 | 6/2006 | Basceri et al. |
| 2006/0121689 | A1 | 6/2006 | Basceri et al. |
| 2006/0198955 | A1 | 9/2006 | Zheng et al. |
| 2006/0204649 | A1 | 9/2006 | Beaman et al. |
| 2006/0205187 | A1 | 9/2006 | Zheng et al. |
| 2006/0213440 | A1 | 9/2006 | Zheng et al. |

FOREIGN PATENT DOCUMENTS

| | | |
|---|---|---|
| EP | 8-34678 A | 2/1996 |
| JP | 62235728 A | 10/1987 |
| JP | 62263629 A | 11/1987 |

Henning, A.K., et al., "Microfluidic MEMS for Semiconductor Processing," IEEE Trans. Components, Packaging, and Manufactruing Technology B21, pp. 329-337, 1998.

Fitch, J.S., et al., "Pressure-Based Mass-Flow Control Using Thermopneumatically-Actuacted Microvalves," Proceedings, Sensors and Actuators Workshop, pp. 162-165 (Transducers Research Foundation, Cleveland, OH, 1998).

Henning, A.K., "Liquid and gas-liquid phase behavior in thermopneumatically actuated microvalves," Procedings, Micro Fluidic Devices and Systems (SPIE, Bellingham, WA, 1998; A.B. Frazier and C.H. Ahn, eds.), vol. 3515, pp. 53-63.

Henning, A.K., et al., "Performance of MEMS-Based Gas Distribution and Control Systems for Semiconductor Processing", 8 pages, Proceedings, SEMICON West Workshop on Gas Distribution (SEMI, Mountain View, CA, 1998).

Maillefer, D., et al., "A High-Performance Silicon Micropump for Disposable Drug Delivery Systems," pp. 413-417, IEEE, 2001.

Henning A.K., et al., "A thermopneutically actuated microvalve for liquid expansion and proportional control", Proceedings, TRANSDUCERS '97: 1997 International Solid State Sensors and Actuators Conference, pp. 825-828.

University of California, Berkeley, University Extension, "Atomic Layer Deposition," 5 pages, Sep. 24-25, 2001, <http://www.unex.berkeley.edu/eng/br225/1-1.htm>.

Engelke, F., et al., "Determination of Phenylthiohydantoin-Amino Acids by Two-Step Laser Sesorption/Mulltiphoton Ionization," Analytical Chemsitry,vol. 59, No. 6, pp. 909-912, Mar. 15, 1987, The Americal Chemical Society.

Cowin, J.P., et al., "Measurement of Fast Desorption Kinetics of D2 From Tungsten By Lase Induced Thermal Desorption," Surface Science, vol. 78, pp. 545-564, 1978, North-Holland Publishing Company.

Ready, J.F., "Effects Due to Absorption of Lser Radiation," Journal of Applied Physics, vol. 36, No. 2, pp. 462-468, Feb. 1965, Journal of Applied Physics, American Instituteof Physics.

Zare, R.N., et al. "Mass Spectrometry of Molecular Adsorbates Using Laser Desorption/Laser Multiphoton Ionization," Bulletin of the Chemical Society of Japan, vol. 61, No. 1, pp. 87-92, Jan. 1988.

Tokyo Electron Limited, Plasma Process System, Trias SPA, 1 page, retrieved from the Internet on Oct. 16, 2004, <http://www.tel.com/eng/products/spe/sdtriasspa.htm>.

Olsson, A., "Valve-less Diffuser Micropumps", ISSN 0281-2878, 66 pages, 1998.

Bardell, R.L., et al., "Designing High-Performance Micro-Pumps Based on No-Moving-Parts Valves", DSC-vol. 62/HTD-vol. 354, Microelectromechanical Systems (MEMS) ASME 1997, pp. 47-53.

Henning, A.K., et al., "Performance of MEMS-Based Gas Distribution and Control Systems for Semiconductor Processing," Proceedings, Micromachined Devices and Components (SPIE, Bellingham, WA, 1998; P.J. French and K. Chjau, eds.), vol. 3514, pp. 159-170

Henning, A.K. et al., "Contamination Reduction Using MEMS-Based, High-Precision Mass Flow Controllers,"Proceedings, SEMICON West Symposium on Contamination Free Manufacturing for Semiconductor Processing (SEMI, Mountain View, CA, 1998), pp. 1-11.

Henning, A.K., "Microfluidic MEMS," Proceedings, IEEE Aerospace Conference, Paper 4.906(IEEE Press, Piscataway, NJ, 1998), 16 pages.

Peters, L., "Thermal Processing's Tool of Choice: Single-Wafer RTP or Fast Ramp Batch?" Semiconductor International, Apr. 1, 1998, 8 pages, <http://www.e-incite.net/semiconductor/index.asp?alyout+article&articleid=CA163937>.

The University of Adelaide, Australia, Department of Chemistry, "Spectroscopy", 2 pages, retrieved from the Internet on Feb. 9, 2002, <http://www.chemistry.adelaide.edu.au/external/Soc-Rel/Content/spectros.htm>.

Deublin Company, "Sealing," 2 pages, retrieved from the Internet on Feb 4, 2002, <http://www.deublin.com/products/sealing.htm>.

Deublin Company, "Precision Rotating Connections for Water, Steam, Air, Hydraulic, Vacuum, Coolant and Hot Oil Service," 1page , retrieved from the the Internet on Feb. 4, 2002, <http://www.deublin.com>.

Integrated Process Systems Ltd., "NAno-ALD", 2 pages, retrieved from the Internet on Dec. 11, 2001, <http://www.ips-tech.com/eng/pro-p2. htm>.

Integrated Process Systems Ltd., "Welcome to IPS Ltd.", 1 page, retrieved from the Internet on Dec. 11, 2001, <http://www.ips-tech.com/eng/main.htm>.

U.S. Appl. No. 11/115,728, filed Apr. 26, 2005, inventor Qin.

Aera Corporation, "Fundamentals of Mass Flow Control," 1 page, retrieved from the Internet on Mar. 6, 2003, <http://www.aeramfc.com/funda.shtml>.

Electronic Times, "Atomic Layer Deposition Chamber Works at Low Temperatures," 2 pages, Dec. 11, 2001, 2001 CMP Europe Ltd., <http://www.electronicstimes.com/story/OEG20010719S0042>.

EMCO Flow Systems, "Mach One Mass Flow Controllers", 1 page, retrieved from the Internet on Nov. 7, 2003, <http://emcoflow.com/mach-one.htm>.

EMCO Flow Systems, "Mach One Mass Flow Controller Product Brochure" 6 pages, retrieved from the Internet on Nov. 7, 2003, <http://www.emcoflow.com/literature/brochures_product_sheets/mach_one/mach_one_brochure_2_01.pdf<.

SemiZone, EMCO Flow Systems Granted Patent for the Mach One Mass Flow Controller for the Semiconductor industry (Jun. 28, 2001), 2 pages, retrieved from the Internet on Nov. 7, 2003, <http://www.semizone.com/news/item?news_item_id+100223>.

Takahashi, K et al., "Process Integration of 3D Chip Stack with Vertical Interconnection," pp. 601-609, 2004 Electronic Components and Technology Conference, IEEE, Jun. 2004.

MKS Instruments, Data Sheet, Downstream Plasma Source, Type AX7610, 4 pages, Dec. 2002, <http://www.mksinst.com/docs/UR/ASTEXax7610DS.pdf>.

MKS Instruments, ASTeX® Microwave Plasma Sources and Subsystems, 1 page, retrieved from the Internet on Nov. 19, 2004, <http://www.mksinst.com/PRG2.html>.

* cited by examiner

METHODS AND APPARATUS FOR PROCESSING MICROFEATURE WORKPIECES; METHODS FOR CONDITIONING ALD REACTION CHAMBERS

TECHNICAL FIELD

The present invention is related to equipment and methods for processing microfeature workpieces, e.g., semiconductor wafers. Aspects of the invention have particular utility in connection with deposition of materials on microfeature workpieces by atomic layer deposition.

BACKGROUND

Thin film deposition techniques are widely used in the manufacturing of microfeatures to form a coating on a workpiece that closely conforms to the surface topography. In the context of microelectronic components, for example, the size of the individual components in the devices on a wafer is constantly decreasing, and the number of layers in the devices is increasing. As a result, the density of components and the aspect ratios of depressions (e.g., the ratio of the depth to the size of the opening) are increasing. Thin film deposition techniques accordingly strive to produce highly uniform conformal layers that cover the sidewalls, bottoms, and corners in deep depressions that have very small openings.

One widely used thin film deposition technique is chemical vapor deposition (CVD). In a CVD system, one or more precursors that are capable of reacting to form a solid thin film are mixed in a gas or vapor state, and then the precursor mixture is presented to the surface of the workpiece. The surface of the workpiece catalyzes the reaction between the precursors to form a solid thin film at the workpiece surface. A common way to catalyze the reaction at the surface of the workpiece is to heat the workpiece to a temperature that causes the reaction. Such CVD processes are routinely employed in many stages of microelectronic component manufacture, for example.

Thin layers of titanium nitride have utility in a number of applications. For example, the electrical conductivity of TiN makes it a useful component of microelectronic capacitors used in DRAM cells. (See, e.g., U.S. Pat. No. 6,211,033, the entirety of which is incorporated herein by reference, which suggests depositing titanium nitride or titanium carbonitride as part of a microelectronic capacitor electrode.) When processing individual wafers in single-wafer CVD reactors, the wafer is heated to the requisite reaction temperature by a heating plate in contact with the wafer.

When the precursors are introduced to the chamber, a secondary deposit of the reaction product may accumulate on the walls of the process chamber as well. This reaction product will build up over time as successive microfeature workpieces are treated. This build-up can be uneven and can be subject to thermal stresses caused by the variations in temperature encountered when heating successive wafers to the requisite deposition temperature. Over time, the coating can degrade and begin to spall or shed particles that may render the finished workpieces commercially unsalable. In so-called "cold-wall" reactors, the walls of the reactor are cooler than the wafer and less of the reaction product may be deposited on the walls. Cold-wall reactors also reduce the thermal stresses on the secondary deposit by reducing the amplitude of the temperature cycle encountered in treating successive workpieces. Yet, even cold-wall reactors start to deposit particles on the workpieces after a time.

To reduce the risk of particle contamination, the interior of the reaction chamber must be cleaned from time to time. For example, a plasma of an etchant gas (e.g., $NF_3$) can be introduced to the chamber to remove the build-up from the chamber walls. Such plasma cleaning processes or thermal cleaning processes (also known in the art) can lead to other particle problems, though. For example, fluorine from $NF_3$ etchant gas can remain on the walls of the reactor and promote shedding of the secondary deposits on the chamber walls. As a result, the walls of these reactors are commonly conditioned after cleaning by applying a layer of the material to be deposited on the workpieces on the chamber wall before any workpieces are deposited.

Single-wafer reactors have limited throughput. To increase throughput, CVD reactors may be adapted to process a plurality of wafers (e.g., 20–250) simultaneously in a batch process. Such batch CVD reactors have proven very cost-effective for many materials. For some other materials, though, batch CVD processes are not commercially viable. For example, attempts to develop batch CVD processes to deposit TiN on microfeature workpieces in commercial production have had little success. One of the problems encountered in batch TiN deposition via CVD is excessive particle generation. Even with a regular cleaning regimen, batch CVD reactors used to deposit TiN shed particles to the extent that product losses and quality control problems often outweigh the commercial advantages otherwise achievable in a batch process. Consequently, applying TiN films using batch CVD has met with very limited commercial acceptance.

Atomic layer deposition (ALD) is a thin film deposition technique gaining prominence in deposition of TiN and other materials on microfeature workpieces. FIGS. 1A and 1B schematically illustrate the basic operation of ALD processes. Referring to FIG. 1A, a layer of gas molecules A coats the surface of a workpiece W. The layer of A molecules is formed by exposing the workpiece W to a precursor gas containing A molecules, and then purging the chamber with a purge gas to remove excess A molecules. This process can form a monolayer of A molecules on the surface of the workpiece W because the A molecules at the surface are held in place during the purge cycle by physical adsorption forces at moderate temperatures or chemisorption forces at higher temperatures. The layer of A molecules is then exposed to another precursor gas containing B molecules. The A molecules react with the B molecules to form an extremely thin layer of solid material C on the workpiece W. Such thin layers are typically less than 1 nm (and usually less than 2 Å) thick and are referred to herein as nanolayers. For example, each cycle may form a layer having a thickness of approximately 0.5–1.0 Å. The chamber is then purged again with a purge gas to remove excess B molecules.

Films deposited via ALD tend to have higher purity and better conformality to microfeature topography than analogous films deposited via CVD. In addition, ALD is often carried out a lower temperature than CVD processes to deposit analogous materials, reducing thermal stresses on material built up on the inner surfaces of the process chamber. As a consequence, some of the difficulties encountered when depositing TiN in a batch CVD process can be ameliorated and batch ALD processing is garnering attention as a commercially viable process for depositing thin films of TiN on microfeature workpieces. Increasing throughput of batch ALD systems would further enhance the commercial benefit of such systems.

DETAILED DESCRIPTION

A. Overview

Various embodiments of the present invention provide microfeature workpiece processing systems and methods for depositing materials onto microfeature workpieces. Many specific details of the invention are described below with reference to exemplary systems for depositing materials onto microfeature workpieces. The term "microfeature workpiece" is used throughout to include substrates upon which and/or in which microelectronic devices, micromechanical devices, data storage elements, read/write components, and other features are fabricated. For example, microfeature workpieces can be semiconductor wafers such as silicon or gallium arsenide wafers, glass substrates, insulative substrates, and many other types of materials. The microfeature workpieces typically have submicron features with dimensions of 0.05 microns or greater. Furthermore, the term "gas" is used throughout to include any form of matter that has no fixed shape and will conform in volume to the space available, which specifically includes vapors (i.e., a gas having a temperature less than the critical temperature so that it may be liquefied or solidified by compression at a constant temperature). Several embodiments in accordance with the invention are set forth in FIGS. 2–6 and the following text to provide a thorough understanding of particular embodiments of the invention. A person skilled in the art will understand, however, that the invention may have additional embodiments, or that the invention may be practiced without several of the details of the embodiments shown in FIGS. 2–6.

For ease of understanding, the following discussion is subdivided into two areas of emphasis. The first section discusses aspects of processing systems that may be used in accordance with selected embodiments of the invention. The second section outlines methods in accordance with other aspects of the invention.

B. Microfeature Workpiece Processing System

Figure 1A:
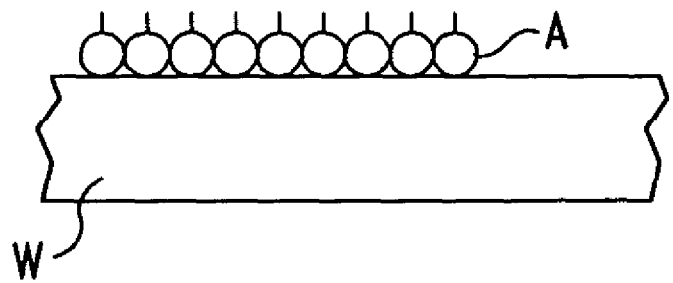
FIGS. 1A and 1B are schematic cross-sectional views of stages in ALD processing in accordance with the prior art.
Figure 1B:
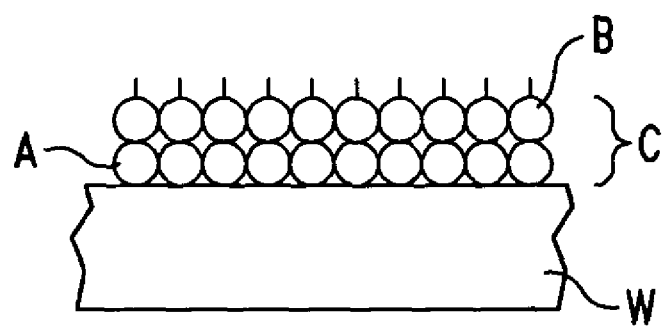
Figure 2:
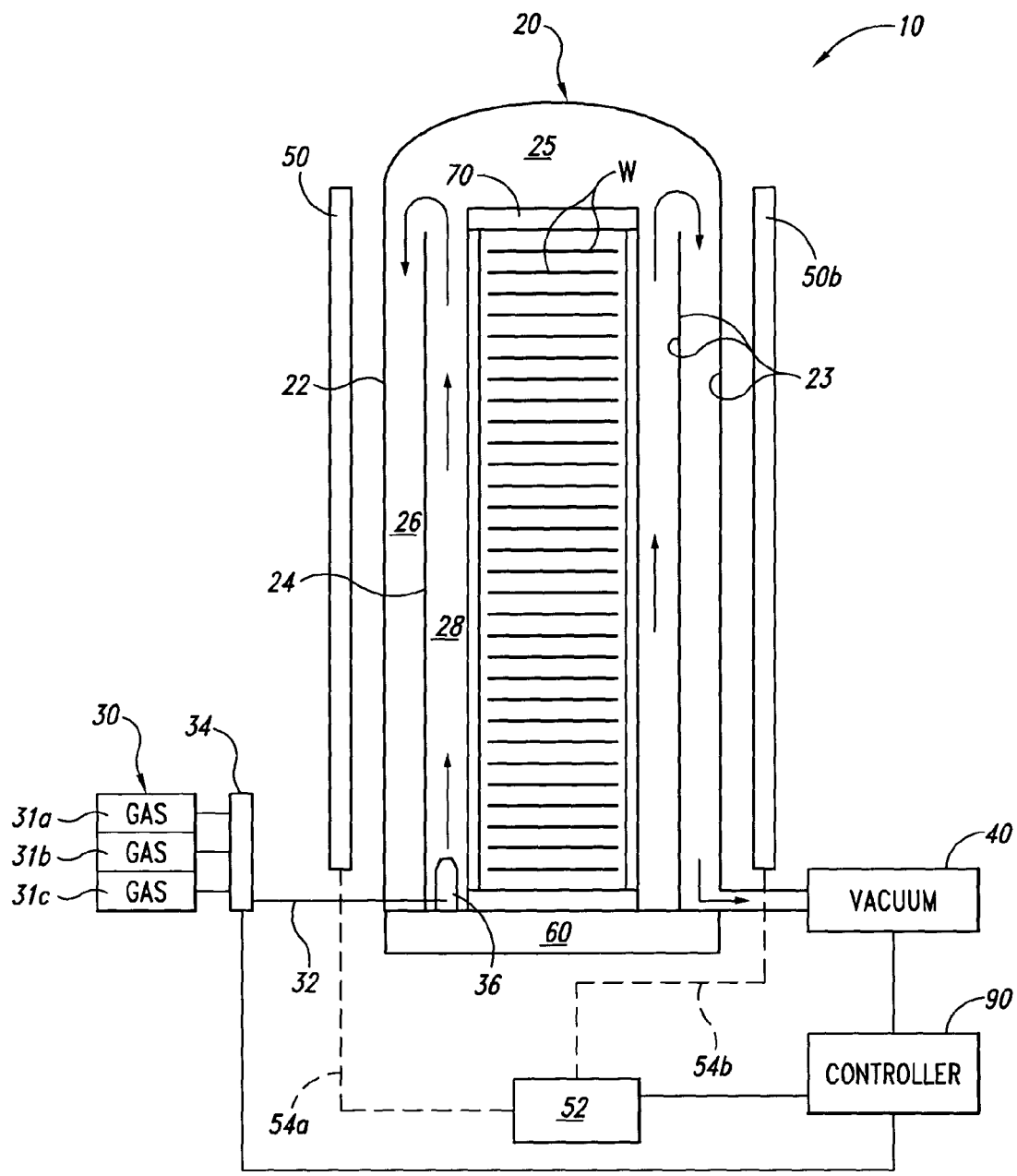
FIG. 2 is a schematic cross-sectional view of a microfeature workpiece processing system in accordance with an embodiment of the invention.

FIG. 2 schematically illustrates a reactor 10 in accordance with one embodiment of the invention. This reactor 10 includes a processing enclosure 20 coupled to a gas supply 30 and a vacuum 40. The processing enclosure 20 generally includes an outer wall 22 and an annular liner 24. A platform 60 seals against the outer wall 22 or some other part of the enclosure 20 to define a deposition chamber 25. The liner 24 functionally divides the deposition chamber 25 into a main chamber 28 and an annular exhaust 26. The deposition chamber 25 also includes inner surfaces 23. The inner surfaces 23 may comprise an inner surface of the outer wall 22 (including the dome at the top of the enclosure 20), the surfaces of at least a portion of the liner 24, and the surfaces of the workpiece holder.

Figure 3:
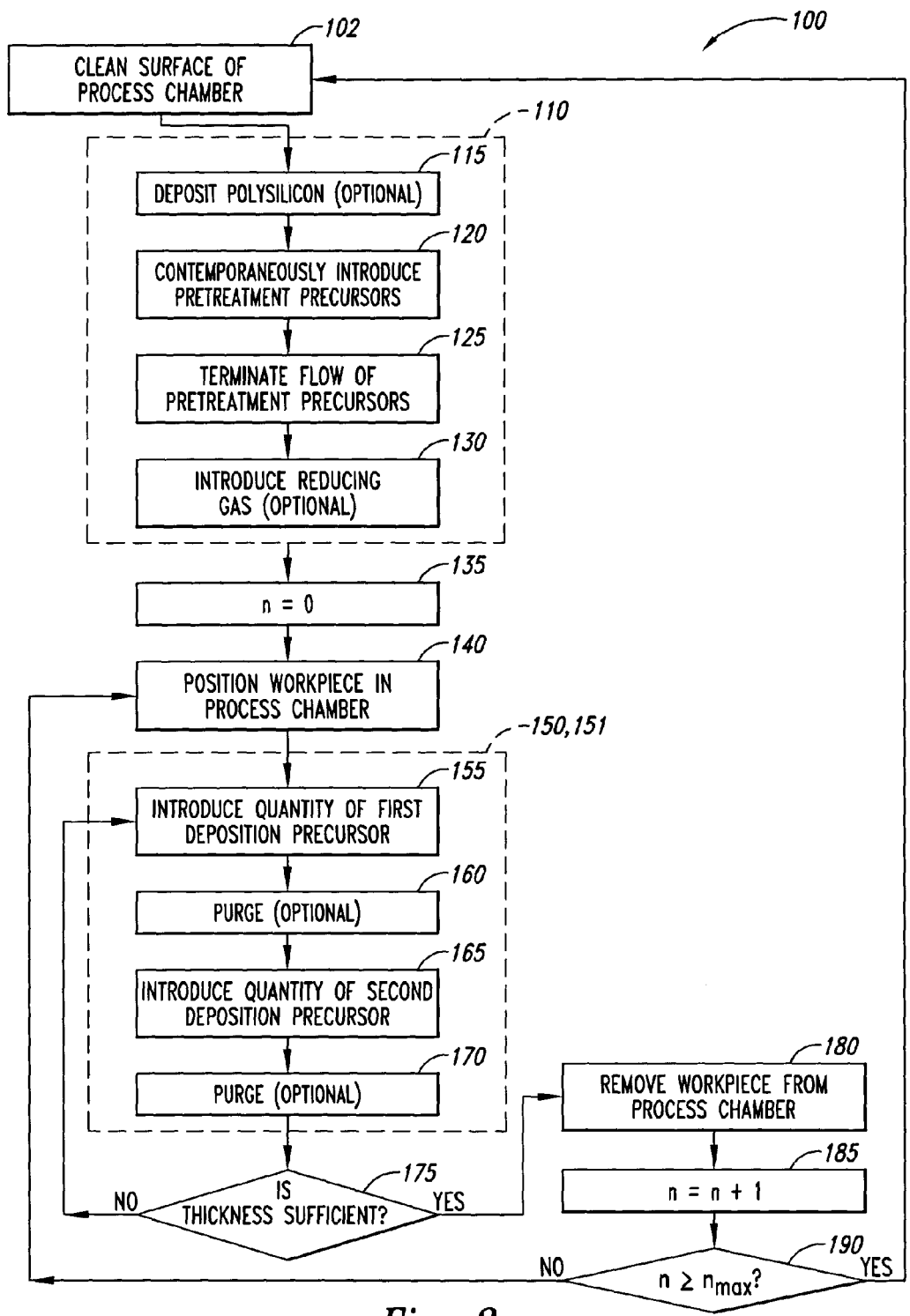
FIG. 3 is a flow chart schematically outlining aspects of a method in accordance with an embodiment of the invention.

One or more microfeature workpieces W, e.g., semiconductor wafers, may be positioned in the deposition chamber 25 for processing. In the illustrated embodiment, a plurality of microfeature workpieces W is held in the processing enclosure in a workpiece holder 70. It should be understood that FIG. 3 is merely schematic in nature and any number (e.g., 20–250) of workpieces W may be held in the workpiece holder 70 for simultaneous batch processing.

The reactor 10 also includes at least one heat source to heat the workpieces W and maintain them at the desired temperature. The heat source in FIG. 2 is typified as a radiant heater 50 comprising a series of radiant heat panels 50a and 50b arranged about a circumference of the enclosure 20 to evenly heat the workpieces W. In one embodiment, these heat panels 50a–b comprise quartz-halogen lamps or other types of radiative heat sources. In other embodiments, other types of heat sources may be employed. The heater 50 may also include a power supply 52 that is coupled to the first heat panel 50a by a first power line 54a and to the second heat panel 50b by a second power line 54b.

Gas is introduced from the gas supply 30 to the deposition chamber 25 by a gas line 32 and an inlet 36. The inlet 36 directs a flow of gas into the main chamber 28 of the deposition chamber 25. Under influence of the vacuum 40, gas introduced via the gas inlet 36 will flow through the main chamber 28, outwardly into the annular exhaust 26, and out of the deposition chamber 25. A valve assembly 34 in the gas line 32 may be operated by a controller 90 to deliver gases to the deposition chamber 25 during the deposition phase. In one embodiment, the controller 90 comprises a computer having a programmable processor programmed to control operation of the reactor 10 to deposit material on the workpieces W in accordance with one or more of the methods outlined below. The controller 90 may be coupled to the vacuum 40 to control its operation. The controller 90 may also be operatively connected to the heater 50, e.g., via the power supply 52, to control the temperature of the workpieces W.

Some aspects of the gas supply 30 will depend on the nature of the deposition process to be carried out in the reactor 10. In one embodiment, the reactor 10 is adapted to carry out an ALD process employing multiple precursors. The gas supply 30 in such embodiments can include a plurality of separate gas sources 31a–c and the valve assembly 34 may have a plurality of valves. For example, the gas supply 30 may include one or more precursors capable of reacting to deposit titanium nitride. In one such implementation, the first gas source 31a is adapted to deliver $TiCl_4$, the second gas source 31b is adapted to deliver $NH_3$, and the third gas source 31c is adapted to deliver a flow of a purge gas, e.g., nitrogen. In another implementation, the first gas source 31a is adapted to deliver an organotitanate, e.g., tetrakis(dimethylamido)titanium (TDMAT), and the second gas source 31b is adapted to deliver a nitrogen carrier gas. The third gas source 31c may be omitted in the latter implementation, or the third gas supply 31c may include a supply of $SiH_4$ or other material comprising silicon for purposes of depositing a layer of polysilicon in accordance with other aspects of the invention.

C. Methods for Processing Microfeature Workpieces

As noted above, embodiments of the invention provide methods for processing microfeature workpieces. In the following discussion, reference is made to the reactor 10 shown schematically in FIG. 2. It should be understood, though, that reference to this particular reactor 10 is solely for purposes of illustration and that the methods outlined below are not limited to any particular processing system.

FIG. 3 schematically illustrates a manufacturing process 100 in accordance with one particular embodiment of the invention. As discussed below, aspects of the invention pretreat the interior surface 23 of an ALD reactor 10 using chemical vapor deposition (CVD) and deposit materials on surfaces of microfeature workpieces via atomic layer deposition (ALD). Both CVD and ALD, as used herein, involve the use of at least one chemical species that can decompose or can react with another chemical species to form a desired material. Such chemical species are referred to herein as "precursors." One of the differences between a CVD process employing two or more precursors and an ALD process employing two or more precursors is the relative timing of the delivery of the precursors to the process chamber 25. In CVD processes, both of the precursors are simultaneously present in and react in a space adjacent a surface; in conventional ALD processes, the precursors are introduced separately and primarily react directly on the surface of the workpiece W.

The manufacturing process 100 of FIG. 3 starts at operation 102 with cleaning the interior surface 23 of the process chamber 25. If the enclosure 20 of the reactor 10 is new, this operation 102 can be skipped. After the reactor 10 has been used for some time, though, material will build up on the inner surface 23, which can adversely affect the quality of microfeature workpieces W treated in the process chamber 25. Some or all of this material build-up can be removed in operation 102 in any suitable fashion. In one embodiment, the material build-up can be removed by exposing the interior of the process chamber 25 to a thermal etch or a plasma etch, e.g., a plasma of nitrogen trifluoride ($NF_3$). In some other circumstances, it may be advantageous to actually dip the outer wall 22 and/or the liner 24 of the enclosure 20 in an enchant liquid. Such cleaning procedures are well known in the art.

After the inner surface 23 of the process chamber 25 has been suitably cleaned, the inner surface 23 can be pretreated, e.g., to reduce particle problems in subsequent ALD processing in the reactor 10. FIG. 3 schematically illustrates aspects of a chamber pretreatment process 110 in accordance with one embodiment of the invention. Generally, the chamber pretreatment process 110 comprises depositing a coating, which may comprise at least one CVD-deposited layer of a pretreatment material. In some embodiments, the chamber pretreatment process 110 is carried out without a microfeature workpiece W in the process chamber 25. This allows the pretreatment material to be deposited on the inner surface 23 of the process chamber 25 at an optimized rate without having to meet the stringent quality requirements for layer(s) of material deposited on microfeature workpieces W.

In one embodiment, the chamber pretreatment process 110 may initially comprise depositing a layer of polycrystalline silicon (commonly referred to as "polysilicon" or just "poly") on the inner surface 23 of the process chamber 25 (process 115 in FIG. 3). This may accomplished, for example, by heating the outer wall 22 and/or the inner wall 24 to a suitable temperature (e.g., about 550° C.) and delivering a silane gas (e.g., $SiH_4$) to the process chamber 25. Techniques for depositing relatively high-quality layers of polysilicon using silane precursors is well known in the art. This polysilicon layer will define a first layer of a coating formed on the inner surface 23 of the process chamber 25 and the pretreatment material formed in processes 120–125 may form the balance of the coating. It is anticipated that depositing a polysilicon layer before the pretreatment material will promote adhesion of the pretreatment material to the inner surface 23.

In process 120, a first pretreatment precursor and a second pretreatment precursor may be introduced to the process chamber 25 contemporaneously, i.e., during an overlapping period of time. The first and second pretreatment precursors may be selected to deposit a desired pretreatment material on the inner surface 23 of the reaction chamber 25 via CVD. During introduction of the first and second pretreatment precursors in process 120, process conditions in the process chamber 25 may be maintained to promote reaction of the precursors to deposit the pretreatment material on the inner surface 23 of the process chamber 25. In one particular embodiment, the first pretreatment precursor comprises titanium and chlorine (e.g., $TiCl_4$) and the second pretreatment precursor comprises nitrogen (e.g., $NH_3$). Suitable temperatures, pressures, and flow rates of such gases to deposit TiN are well known and may be optimized readily by those skilled in the art.

After a suitable thickness of the pretreatment material is deposited on the inner surface 23 of the process chamber 25, the flow of at least one of the precursors into the process chamber 25 may be terminated. The thickness of this pretreatment material may be optimized for the particular process conditions employed to process workpieces in the ensuing steps of the manufacturing process 100. The thickness of the pretreatment material may vary from one location on the inner surface 23 of the process chamber 25 to another. In some embodiments of the invention wherein the pretreatment material comprises TiN, though, an average thickness of the TiN on an inner surface of the liner 24 is less than 1000 Å, e.g., about 500 Å or less, with a thickness of about 100–200 Å expected to work well for many applications.

Figure 4:
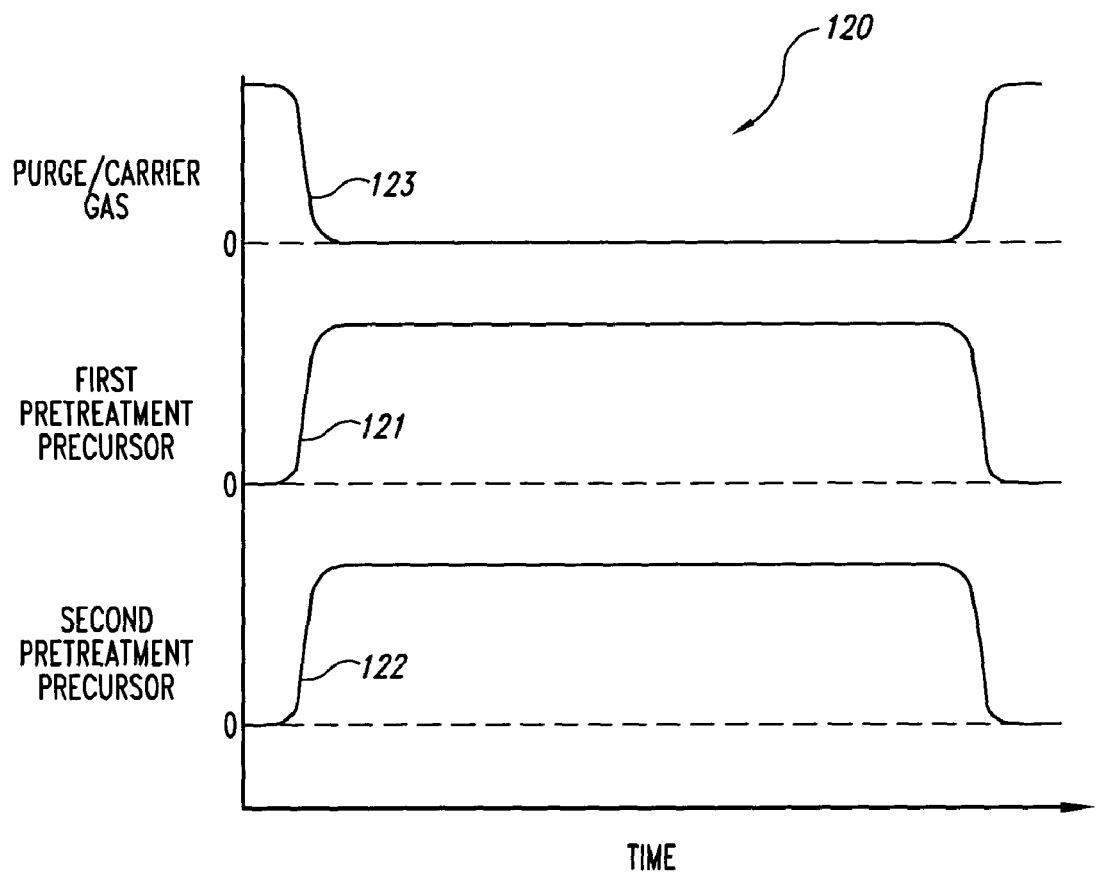
FIG. 4 is a schematic illustration of one exemplary process for pretreating an inner surface of an ALD process chamber.

FIG. 4 schematically illustrates one exemplary gas flow pattern for processes 120 and 125 of FIG. 3. In particular, FIG. 4 plots the flow rate of several gases over time. In this gas introduction process 120, a gaseous first pretreatment precursor flow 121 and a gaseous second pretreatment precursor flow 122 are contemporaneously delivered to the process chamber 25 of the reactor 10. This may be accomplished by controlling the valve assembly 34 to deliver the first precursor, e.g., $TiCl_4$, from the first gas source 31a and the second precursor, e.g., $NH_3$, from the second gas source 31b. Both of these gases are delivered to the main chamber 28 of the process chamber 25 via the gas inlet 36 and allowed to contact the inner surface 23 of the process chamber 25. In FIG. 4, the first gas flow 121 and the second gas flow 122 are shown as starting and ending at substantially the same time. In other embodiments, the first gas flow 121 may start before or after the second gas flow 122 is initiated and the first gas flow 121 may be terminated before or after the second gas flow 122 is terminated. In each of these cases, the first gas flow 121 and the second gas flow 122 may be said to be contemporaneous if they occur simultaneously over a material period of time, i.e., they need not start and/or stop at the same time.

FIG. 4 also schematically illustrates delivery of a purge/carrier gas flow 123. In this embodiment, the purge gas may be delivered to the process chamber 25 before initiating the first and second gas flows 121 and 122 and again delivered after the first and second gas flows 121 and 122 are terminated. Such a purge gas flow 123 may be used in conjunction with the vacuum 40 to purge any residual etchant (e.g., $NF_3$) from the process chamber 25. In other embodiments, the purge/carrier gas may be delivered at the same time as the first and second gaseous precursors, in which case it serves as a more conventional carrier gas to provide adequate gas flow and to control the concentration of the precursors in the gas flow. In the context of FIG. 4, the third gas flow 123 may be delivered by selectively controlling the valve assembly 34 to deliver the purge gas from the third gas source 31c to the gas inlet 36.

As illustrated in FIG. 3, the chamber pretreatment process 110 may also include introducing a reducing gas to the process chamber 25 in process 130 after the flow of at least one of the pretreatment precursors has been terminated in process 125. The reducing gas can improve the quality of the pretreatment material deposited on the inner surface 23 of the reaction chamber 25 by serving as a "getter" of contaminants. For example, if the first and second pretreatment precursors comprise $TiCl_4$ and $NH_3$, some residual amount of chlorine may be retained in the pretreatment material. Contacting this pretreatment material with a reducing gas at an appropriate temperature can remove at least some of the excess chlorine from the pretreatment material. In another embodiment, the pretreatment material is instead formed using an organotitanate (e.g., TDMAT) as the first precursor and nitrogen gas as the second precursor; delivering a reducing gas to the process chamber 25 in process 130 may help scavenge any carbon (e.g., in the form of TiC) included in the deposited TiN. (See, e.g., U.S. Pat. No. 5,956,613, the entirety of which is incorporated herein by reference.) The reducing gas employed in the optional treatment of process 130 may comprise one or more of a variety of hydrogen-containing gases; hydrogen and ammonia are expected to be suitable reducing gases for many applications. Using ammonia as the reducing gas can be particularly convenient in circumstances where ammonia is used as one of the pretreatment precursors in processes 120–125. If the pretreatment material comprises TiN deposited using $TiCl_4$ and $NH_3$, for example, the reducing gas may be introduced in process 130 by terminating the flow of the $TiCl_4$ precursor and allowing the $NH_3$ flow to continue for an additional period of time.

In the manufacturing process 100, the process chamber 25 may be cleaned intermittently. As discussed below, this cleaning process may be conducted after a fixed number ($n_{max}$ in process 190) of cycles for processing individual workpieces W (e.g., for single-workpiece systems) or batches of workpieces W (e.g., for the batch system shown in FIG. 2). A workpiece cycle counter n may be reinitialized at zero in process 135 to reflect that no workpiece process cycles have been conducted in the reactor 10 since the cleaning 102 and pretreatment 110 of the processing chamber 25.

In process 140, one or more microfeature workpieces may be positioned in the cleaned and pretreated process chamber 25. As noted above, embodiments of the invention have particular utility in batch ALD applications. In such embodiments, a number of microfeature workpieces W may be positioned in a workpiece holder 70 and the workpiece holder 70 may be loaded in the process chamber 25.

A deposition product may be deposited on the surface(s) of the microfeature workpiece(s) W in the process chamber 25 using an ALD process 150. This ALD process 150 may generally include introducing a quantity of the first deposition precursor (process 155), optionally purging the process chamber 25 (process 160), introducing a quantity of a second deposition precursor (process 165), and optionally purging the process chamber 25 again. This ALD deposition process 150 may be carried out at processing conditions (e.g., temperature and flow rate) appropriate for the precursors selected. In one embodiment, the ALD-deposited material may comprise a primary species that is the same as a primary species of the pretreatment material deposited in processes 120–130 of the chamber pretreatment process 110. For example, both the pretreatment material and the deposition product deposited on the microfeature workpieces in the ALD process 150 may comprise TiN. If the primary species is the same for both of these deposited materials, the first and second pretreatment precursors introduced in process 120 may comprise the same precursors employed in the ALD process 150.

Figure 5:
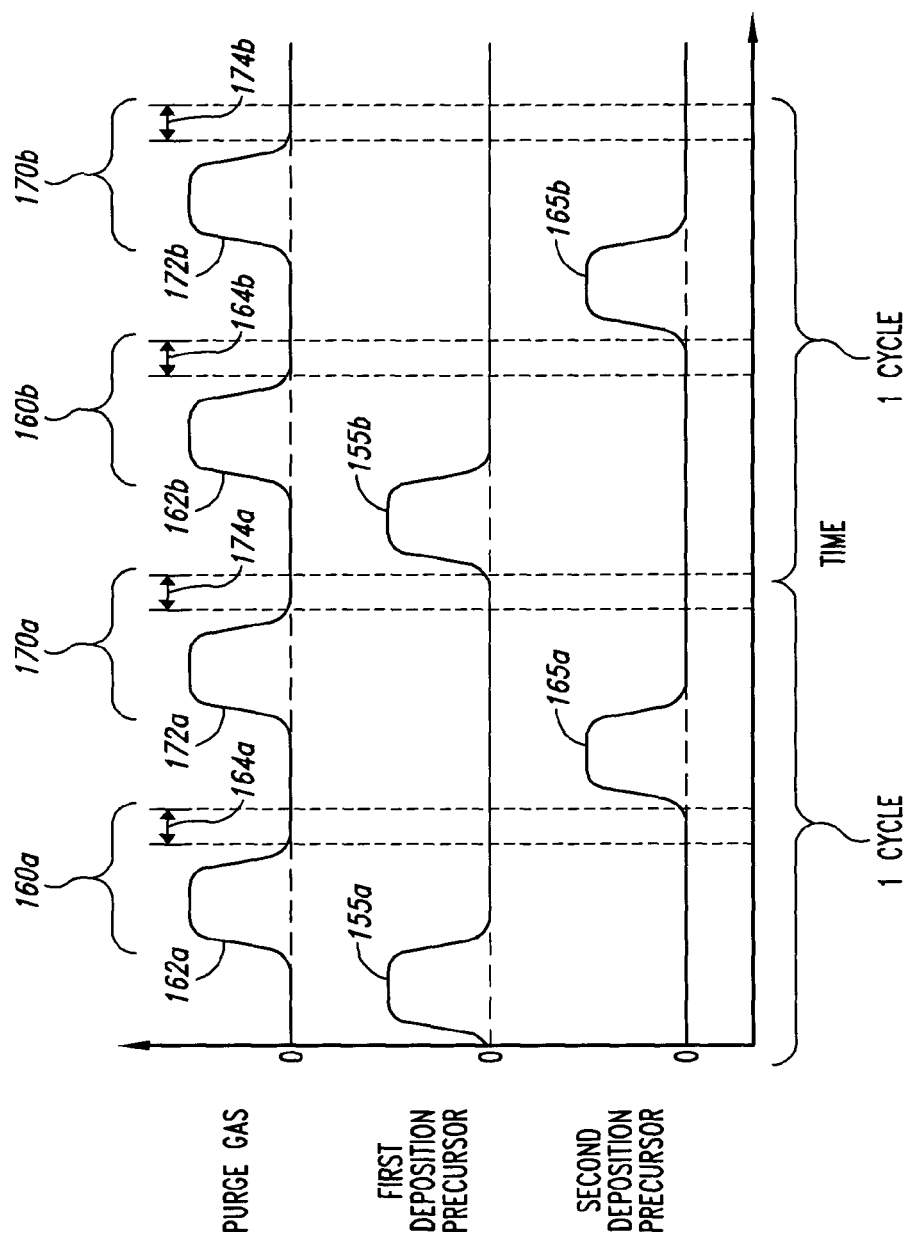
FIG. 5 is a schematic illustration of one exemplary process for depositing material on a surface of a microfeature workpiece.

FIG. 5 is a schematic plot of gas flow rates as a function of time in accordance with one embodiment of the ALD process 150 of FIG. 3. In this ALD process 150, discrete quantities of the first deposition precursor are delivered in first precursor pulses 155a and 155b. Discrete quantities of the second deposition precursor are delivered to the process chamber 25 in second precursor pulses 165a and 165b. The first pulses 155 and second pulses 165 are delivered at different times in an alternating fashion.

Moving down the timeline of FIG. 5, one pulse 155a of the first precursor may be delivered to the process chamber 25 to contact the surfaces of the microfeature workpieces W. The precursor may be at least chemisorbed on the workpiece W. Theoretically, such chemisorbtion will form a monolayer that is uniformly one molecule thick on the entire surface of the workpiece W. Such a monolayer may be referred to as a saturated monolayer. As a practical matter, in some circumstances some minor portions of the workpiece surface may not chemisorb a molecule of the precursor. Nevertheless, such imperfect monolayers are still referred to herein as monolayers. In many applications, a substantially saturated monolayer may be suitable. A substantially saturated monolayer is a monolayer that will yield a deposited layer exhibiting the requisite quality and/or electrical properties.

An excess of the first precursor is typically delivered to the process chamber 25. This excess first precursor can be purged from the vicinity of the workpiece surfaces in process 160. Purging may involve a variety of techniques, including any combination of contacting the substrate and/or monolayer with a purge gas and/or lowering pressure in the process chamber 25 to below the pressure needed to deposit the precursor on the workpiece surface. Examples of suitable purge gases include nitrogen, argon, helium, neon, krypton, and xenon. In the particular embodiment shown in FIG. 5, a first pulse 162a of the purge gas is delivered to the process chamber 25 and a majority or all of this purge gas pulse 162a may take place after the first precursor pulse 155a is completed. The purge process shown in FIG. 5 also includes a pump-down process 164a wherein the vacuum 40 will withdraw gas from the process chamber 25 without introducing any additional gas from the gas supply 30. The parameters of the purge pulse 162a and pump-down 164a may be determined experimentally, as known in the art. The pump-down time and/or the quantity of purge gas in the pulse 162a may be successively reduced until the film growth rate increases. Such an increase in film growth rate may be deemed an indication that excess quantities of the first precursor remain in the process chamber 25, which may be used to establish a minimum purge gas quantity and/or purge time.

Once the process chamber 25 has been suitably purged, a pulse 165a of the second gaseous precursor may be delivered to the process chamber 25. This second precursor may chemisorb on the first monolayer of the first precursor and/or react with the monolayer to form a reaction product. This reaction product is typically one or no more than a few molecules thick, yielding a very thin, highly conformal nanolayer reaction product. After a suitable exposure to the second gaseous precursor, the second precursor pulse 165a may be terminated and the process chamber 25 may be purged again with a pulse 172a of purge gas and/or a pump-down process 174a.

As suggested in FIG. 5, the pair of precursor pulses 155a and 165a, together with the associated pulses 162a and 172b of purge gas and/or pump-down processes 164a and 174b, may be considered one cycle. This cycle will form a nanolayer that is usually thinner than the desired total thickness, with typical thicknesses of just 1 or 2 molecules (e.g., less than 1 nm, often less than 2 Å). As a consequence, the cycle is often repeated numerous times to yield a layer with an appropriate thickness. Hence, the manufacturing process 100 of FIG. 3 may include determining in process 175 whether the material deposited on the microfeature workpieces W is thick enough. In many circumstances, this determination will comprise determining whether a fixed number of ALD cycles, which has been empirically determined to deposit an adequate thickness, has been performed. If a sufficient thickness has not been deposited, the ALD process 150 may be repeated by returning to process 155 in FIG. 3. This is illustrated in FIG. 5 as a second cycle that involves delivering a further pulse 155b of the first precursor, purging the process chamber 25 with a further purge gas pulse 162b and pump-down 164b, subsequently delivering another second precursor pulse 165b, and again purging the process chamber 25 with another purge gas pulse 172b and pump-down 174b. This ALD process 150 can be repeated as many times as necessary to yield a layer of the desired thickness.

Figure 6:
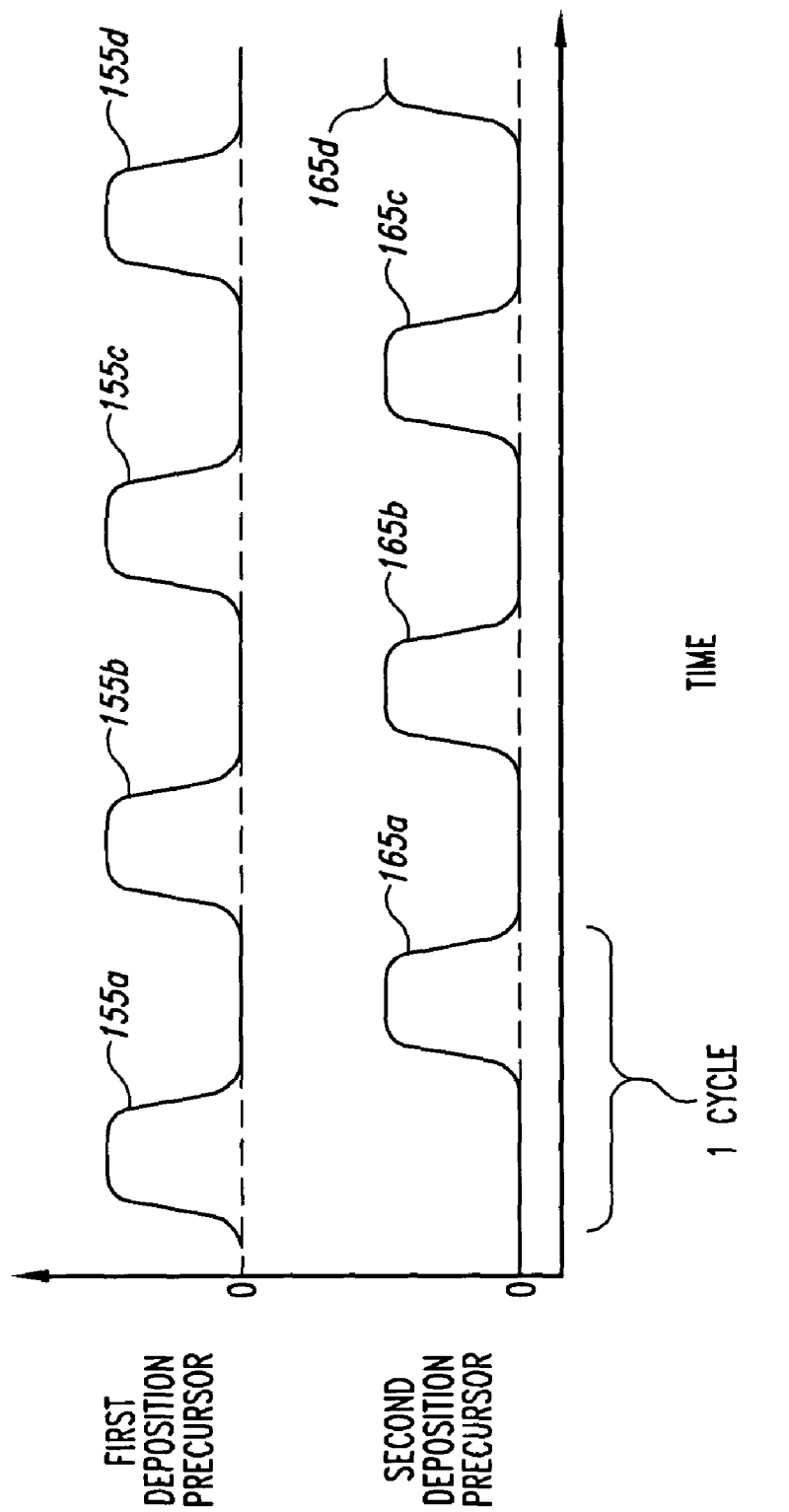
FIG. 6 is a schematic illustration of an alternative process for depositing material on a surface of a microfeature workpiece.

FIG. 6 schematically illustrates a gas flow profile analogous to FIG. 5, but illustrating an ALD process 151 in accordance with another embodiment of the invention. In this ALD process 151, pulses 155a–d of the first gaseous precursor are alternated with pulses 165a–d of the second gaseous precursor. This is similar in some respects to the pulses 155 and 165 illustrated in FIG. 5. However, there is no purge process (160 or 170 in FIG. 5) between delivery of successive quantities of the first and second precursors. Hence, in FIG. 6, the first pulse 165a of the second gaseous precursor may immediately follow completion of the first pulse 155a of the first gaseous precursor. Likewise, the next pulse 155b of the first precursor may immediately follow termination of the first pulse 165a of the second precursor. In this process, a monolayer of the first precursor may be deposited on the surface of the microfeature workpiece W prior to delivery of the pulse of the second precursor. Without the purge phase, though, some of the first precursor may remain in the vicinity of the workpiece W when the next pulse of the second gaseous precursor is initiated. This may result in a gaseous phase reaction between the precursors in a gaseous, unbound phase, leading to direct deposition of the reaction product on the surface of the workpiece W, and an increase in the rate of film formation. By appropriately selecting the process conditions and the timing of the pulses 155 and 165, though, this CVD-like secondary deposition may be held in check and may not significantly adversely affect the quality of the ALD-deposited material.

In other embodiments, the process chamber 25 may be purged between some, but not all, precursor pulses. For example, one pulse (e.g., 155a) of the first precursor and one pulse (e.g., 165a) of the second precursor may form one cycle of material deposition. A purge process, which may comprise delivery of a purge gas and/or a pump-down of the process chamber 25, may be performed between cycles to better promote deposition of a monolayer of the first precursor on the layer of material deposited in the previous cycle.

The process 151 shown in FIG. 6 may not technically conform to conventional definitions of atomic layer deposition because remnants of one precursor are present when the subsequent precursor is introduced. Nonetheless, it is anticipated that such a "pseudo-ALD" process may be useful in depositing some materials, e.g. layers of TiN. As a consequence, the term "ALD" is used herein to refer to both conventional ALD, (e.g., deposition via the process 150 illustrated in FIG. 5) and "pseudo-ALD" (e.g., deposition via the process 151 shown in FIG. 6).

As noted above, if the thickness of the material deposited via the ALD process 150 is determined insufficient in process 175, the ALD process 150 may be repeated. If the deposited reaction product has a thickness at least as great as a target thickness (e.g., if the ALD process 150 has been repeated a fixed number of times), though, the microfeature workpiece W will be removed from the process chamber 25 in process 180. The workpiece cycle counter n, which was initialized at 0 in process 135, may be incremented by one in process 185 to indicate that another workpiece cycle has been completed. In process 190, the workpiece cycle counter n is compared to a fixed number $n_{max}$ of permissible cycles. The number $n_{max}$ of permissible cycles may be determined empirically to strike a balance between increasing throughput by reducing cleaning frequency and cleaning often enough to maintain an acceptable quality level of the processed microfeature workpieces W. If the number of batches of microfeature workpieces W treated is less than the maximum permissible number $n_{max}$, another batch of microfeature workpieces W may be positioned in the process chamber 25 for processing (process 140). If the permissible number $n_{max}$ of workpiece batches has been processed, the process chamber 25 may be cleaned again in process 102, starting the manufacturing process 100 again.

The above-detailed embodiments of the invention are not intended to be exhaustive or to limit the invention to the precise form disclosed above. Specific embodiments of, and examples for, the invention are described above for illustrative purposes, but those skilled in the relevant art will recognize that various equivalent modifications are possible within the scope of the invention. For example, whereas steps are presented in a given order, alternative embodiments may perform steps in a different order. The various embodiments described herein can be combined to provide further embodiments.

Unless the context clearly requires otherwise, throughout the description and the claims, the words "comprise," "comprising," and the like are to be construed in an inclusive sense as opposed to an exclusive or exhaustive sense, i.e., in a sense of "including, but not limited to." Use of the word "or" in the claims in reference to a list of items is intended to cover a) any of the items in the list, b) all of the items in the list, and c) any combination of the items in the list.

In general, the terms used in the following claims should not be construed to limit the invention to the specific embodiments disclosed in the specification unless the above-detailed description explicitly defines such terms. While certain aspects of the invention are presented below in certain claim forms, the inventors contemplate various aspects of the invention in any number of claim forms. Accordingly, the inventors reserve the right to add additional claims after filing the application to pursue such additional claim forms for other aspects of the invention.

What is claimed is:

1. A method for processing microfeature workpieces, comprising:
pretreating a surface of a process chamber before beginning a workpiece deposition process in the process chamber, the pretreating comprising:
depositing a layer comprising polysilicon on the surface; and
contemporaneously introducing a first pretreatment precursor and a second pretreatment precursor to the process chamber to deposit a pretreatment material on the surface of the process chamber, the first pretreatment precursor comprising titanium and the second pretreatment precursor comprising nitrogen;
terminating introduction of the first pretreatment precursor to the process chamber and terminating introduction of the second pretreatment precursor to the process chamber;
after terminating the introduction of the first and second pretreatment precursors, positioning a microfeature workpiece in the process chamber; and
after positioning the microfeature workpiece in the process chamber, depositing a deposition product comprising titanium nitride on a surface of the microfeature workpiece in the workpiece deposition process, the workpiece deposition process comprising alternately introducing a quantity of a first deposition precursor and a quantity of a second deposition precursor to the process chamber, the first deposition precursor comprising titanium and the second deposition precursor comprising nitrogen.

2. The method of claim 1 wherein the first pretreatment precursor and the first deposition precursor comprise the same precursor.

3. The method of claim 1 wherein both the first pretreatment precursor and the first deposition precursor comprise one precursor and both the second pretreatment precursor and the second deposition precursor comprise another precursor.

4. The method of claim 1 wherein a rate of deposition of the pretreatment material is higher than a rate of deposition of the deposition product.

5. The method of claim 1 wherein depositing a layer comprising polysilicon on the surface comprises, a) introducing a poly precursor to the process chamber to deposit a layer comprising polysilicon on the surface, then b) terminating introduction of the poly precursor.

6. The method of claim 1 wherein the first pretreatment material comprises titanium and chlorine, the method further comprising introducing a reducing gas to the process chamber after terminating introduction of the first and second pretreatment precursors to the process chamber.

7. The method of claim 1 wherein the first pretreatment precursor comprises titanium and chlorine and the second pretreatment precursor comprises NH3, the method further comprising introducing the second pretreatment precursor to the process chamber after terminating introduction of the first precursor to the process chamber.

8. The method of claim 1 wherein depositing the deposition product further comprises depositing the deposition product on a surface of the pretreatment material.

9. The method of claim 1 wherein the pretreatment material is deposited on the surface of the process chamber without a microfeature workpiece in the process chamber.

10. The method of claim 1 further comprising cleaning the surface of the process chamber before the depositing the pretreatment material.

11. A method for processing microfeature workpieces, comprising:
cleaning an inner surface of a process chamber;
after the cleaning but prior to depositing material on a first microfeature workpiece, depositing a coating on the cleaned surface of the process chamber by contemporaneously introducing a gaseous first precursor and a gaseous second precursor to the process chamber to deposit a first reaction product at a first deposition rate, wherein depositing the coating further comprises depositing a layer comprising polysilicon on the cleaned surface prior to depositing the first reaction product;
after depositing the coating, positioning the first microfeature workpiece in the process chamber; and
after positioning the first microfeature workpiece, depositing a second reaction product on a surface of the microfeature workpiece at a second rate, which is lower than the first rate, by depositing a precursor layer of the first precursor at least one monolayer thick and exposing the precursor layer to the second precursor to form a nanolayer reaction product.

12. A method for processing microfeature workpieces, comprising:
cleaning an inner surface of a process chamber;
after the cleaning but prior to depositing material on a first microfeature workpiece, depositing a coating on the cleaned surface of the process chamber by contemporaneously introducing a gaseous first precursor and a gaseous second precursor to the process chamber to deposit a first reaction product at a first deposition rate;
after depositing the coating, positioning the first microfeature workpiece in the process chamber;
after positioning the first microfeature workpiece, depositing a second reaction product on a surface of the microfeature workpiece at a second rate, which is lower than the first rate, by depositing a precursor layer of the first precursor at least one monolayer thick and exposing the precursor layer to the second precursor to form a nanolayer reaction product; and
prior to depositing the first reaction product, introducing a third precursor to the process chamber to deposit a layer comprising polysilicon on the cleaned surface, wherein the first reaction product is deposited on the layer comprising polysilicon.

* * * * *

UNITED STATES PATENT AND TRADEMARK OFFICE
CERTIFICATE OF CORRECTION

PATENT NO. : 7,344,755 B2  Page 1 of 1
APPLICATION NO. : 10/646673
DATED : March 18, 2008
INVENTOR(S) : Beaman et al.

It is certified that error appears in the above-identified patent and that said Letters Patent is hereby corrected as shown below:

On the Title page, in field (75), in "Inventors", in column 1, line 5, delete "Boise, ID" and insert -- Pflugerville, Texas --, therefor.

On the Title page, in field (57), under "Abstract", in column 2, line 8, after "a" delete "the".

In column 12, line 1, in Claim 7, delete "NH3," and insert -- $NH_3$, --, therefor.

Signed and Sealed this

Twenty-second Day of July, 2008

JON W. DUDAS
*Director of the United States Patent and Trademark Office*